(12) United States Patent
Shin et al.

(10) Patent No.: US 7,514,671 B2
(45) Date of Patent: Apr. 7, 2009

(54) OPTICAL DISK APPARATUS

(75) Inventors: Dong-Yeon Shin, Suwon-si (KR);
Dong-Woo Rhee, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 54 days.

(21) Appl. No.: 11/516,771

(22) Filed: Sep. 7, 2006

(65) Prior Publication Data

US 2007/0131854 A1    Jun. 14, 2007

(30) Foreign Application Priority Data

Dec. 9, 2005    (KR) .................. 10-2005-0120758

(51) Int. Cl.
*G01D 5/34* (2006.01)
*H01J 40/14* (2006.01)
*H01L 23/48* (2006.01)

(52) U.S. Cl. .................. 250/231.13; 250/239; 257/692; 257/774

(58) Field of Classification Search .................. 250/239, 250/231.13, 231.14; 257/433, 434, 690, 257/692–693, 698, 774; 438/64, 65
See application file for complete search history.

(56) References Cited

U.S. PATENT DOCUMENTS

2003/0146384 A1* 8/2003 Logsdon et al. .......... 250/338.1
2004/0211890 A1* 10/2004 Setbacken et al. ...... 250/231.13

FOREIGN PATENT DOCUMENTS

KR    10-0168410    8/1990
KR    20-0255615    12/2001

* cited by examiner

*Primary Examiner*—Kevin Pyo

(57) ABSTRACT

An optical disk apparatus includes a printed circuit board; a stator fixed on the printed circuit board; a rotor configured to receive an optical disk thereon, the rotor being rotated by an electromagnetic interaction with the stator; and a sensing part fixed on the printed circuit board and sensing a rotation of the optical disk. Here, the sensing part includes a sensor; a terminal connecting the sensor with the printed circuit board electrically; and a plastic mold fixing the terminal thereto. The optical disk apparatus has a reduced number of components to allow reduced production costs, and has a simple manufacturing process to allow reduced production times and defect rate.

7 Claims, 4 Drawing Sheets

OPTICAL DISK APPARATUS

CROSS-REFERENCE TO RELATED APPLICATIONS

This application claims the benefit of Korean Patent Application No. 2005-0120758 filed with the Korean Intellectual Property Office on Dec. 9, 2005, the disclosure of which is incorporated herein by reference in its entirety.

BACKGROUND

1. Technical Field

The present invention relates to an optical disk apparatus which has a sensing part fixed on a printed circuit board and which ensures a sufficient height for signal recognition with respect to an optical disk.

2. Description of the Related Art

The optical encoder is used in hard disks, compact disk players, and DVD players, etc., which is a sensor for measuring the number of rotations of a disk or hard disk, where a motor structure having such an optical encoder is illustrated in FIG. 1.

Referring to FIG. 1, the motor structure mainly comprises a disk 21, a motor providing rotational force to the disk 21, and an optical encoder detecting the rotation speed (rpm) of the disk 21.

The motor consists of a stator, which is fixed to a metal plate 11 and a printed circuit board 13 and which includes a metal bearing 27, a holder 29, and coils 33, and a rotor, which rotates together with the disk 21 and which includes a shaft 15, a rotation member 23, magnets 17, and a chuck 25, etc.

An electric current inputted from outside via the printed circuit board 13 is inputted to the coils 33, by which an electric field is generated around the coils 33. The interaction between the electric field thus generated and the magnetic field generated by the magnet 17 creates an electromagnetic force, which enables the rotor of the motor to rotate.

The holder 29 is fixed to the metal plate 11 and the printed circuit board 13, and the metal bearing 27 is inserted within the holder 29 to allow smoother rotation of the shaft 15. The shaft 15 rotates together with the disk 21 while supported by the holder 29 and the metal bearing 27, with the chuck 25 attached to the end of the shaft 15. The chuck 25 is of a structure that allows the mounting and demounting of the disk 21. Also, a sensor 19 capable of detecting the speed of the disk 21 is fixed onto the printed circuit board 13 by means of the holder 16.

Referring to FIG. 2, a conventional sensor 19 fixing device includes a holder 39 fixed onto a metal plate 11 by means of a screw 41, and a flexible printed circuit board 35 fixed onto the holder 39 by means of double-sided tape 37, etc. The flexible printed circuit board 35 is fixed to the printed circuit board 13 and the sensor 19 by means of solder 43. The sensor 19 is fixed to the flexible printed circuit board 35 by a reflow process.

A conventional sensor fixing device comprised as above is manufactured by the following process. First, the sensor 19 is fixed onto the flexible printed circuit board 35 by a reflow process. After fixing the flexible printed circuit board 35 onto the plastic holder 39 with double-sided tape 37, the sensor 19 and the flexible printed circuit board 35 are generally welded together. Then, after fixing the holder to the metal plate 11 using a screw 41, the printed circuit board 13 is fixed onto the metal plate 11 using double-sided tape 37, and the flexible printed circuit board 35 and the printed circuit board 13 are electrically connected using solder.

As shown above, a conventional sensor fixing device not only involves a relatively large number of components, as it requires double-sided tape 37 and the flexible printed circuit board 35, etc., but it also involves a large number of processes for joining each of the components. Thus, a conventional sensor fixing device entails complicated processes and high costs, and also incurs the problem of high defect rates.

SUMMARY

The present invention aims to provide a sensor fixing device having a reduced number of components and a simplified assembly process.

One aspect of the present invention provides a sensor fixing device comprising a sensor, a holder which comprises a terminal fixed to the sensor and which has a particular height, and a printed circuit board which has the holder fixed thereto and which is electrically connected with the terminal.

Embodiments of the invention may include one or more of the following features. For example, the sensor may be an optical encoder and may be fixed to the terminal by means of solder. The terminal may be fixed to the printed circuit board.

The terminal may comprise a board fixing part fixed to the printed circuit board, a vertical part extending from the board fixing part and having a particular height, and a sensor fixing part extending from an end of the vertical part and electrically connected with the sensor. The sensor fixing part may be fixed to the sensor by means of solder. The board fixing part may be fixed to the printed circuit board by means of solder. Also, the holder may have a mold for fixing the terminal, and the printed circuit board may be supported by a metal plate.

Additional aspects and advantages of the present invention will be set forth in part in the description which follows and in part will be obvious from the description, or may be learned by practice of the invention.

DETAILED DESCRIPTION

Below, embodiments of the sensor fixing device according to the invention will be described in more detail with reference to the accompanying drawings. In the description with reference to the accompanying drawings, those components are rendered the same reference number that are the same or are in correspondence regardless of the figure number, and redundant explanations are omitted.

Figure 1:
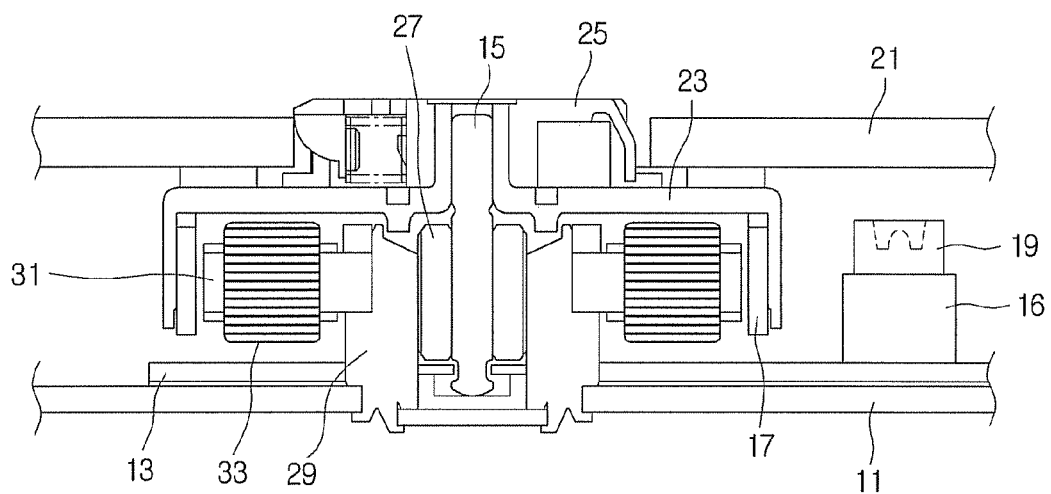
FIG. 1 is a cross-sectional view of a motor having a conventional optical encoder.
Figure 2:
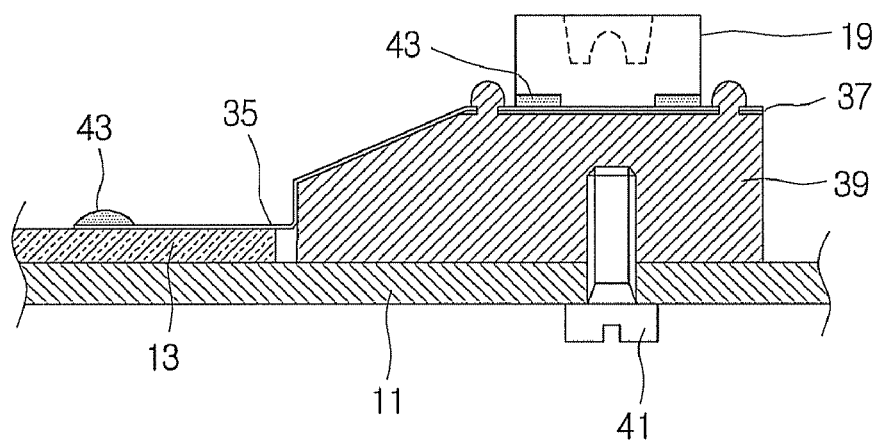
FIG. 2 is a cross-sectional view of a conventional sensor fixing device.
Figure 3:
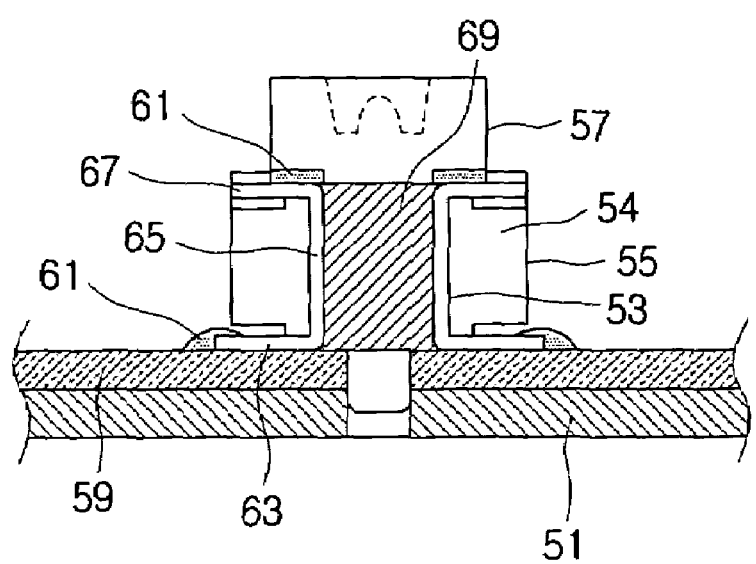
FIG. 3 is a cross-sectional view of a sensor fixing device according to an embodiment of the present invention.

Referring to FIG. 3, a sensor fixing device according to an embodiment of the invention comprises a sensor 57, a holder 55 to which the sensor 57 is fixed, and a printed circuit board 59 to which the holder 55 is fixed. The sensor 57 is fixed to the holder 55 by means of solder, etc., and the holder 55 is also fixed to the printed circuit board 59 by means of solder, etc.

The sensor fixing device based on the present invention does not require additional double-sided tape or flexible printed circuit boards, etc., as do conventional sensor fixing devices, and because the holder 55 may be fixed to the printed circuit board 59 and the sensor 57 to the holder 55 simply by a process such as soldering, etc., the number of components can be reduced, and the assembly process can be simplified.

A description will be provided below on the composition of the sensor fixing device.

The sensor 57, as illustrated in FIG. 3, is placed under the reverse side of the disk to detect the rotation speed of the disk. The sensor 57 is fixed by means of solder to the terminal 53 of the holder 55. The sensor 57 needs to be fixed with a certain distance from the reverse surface of the disk, and the height at which the sensor 57 is fixed is determined by the holder 55. The sensor 57 may be, but is not limited to, an optical encoder.

Figure 4:
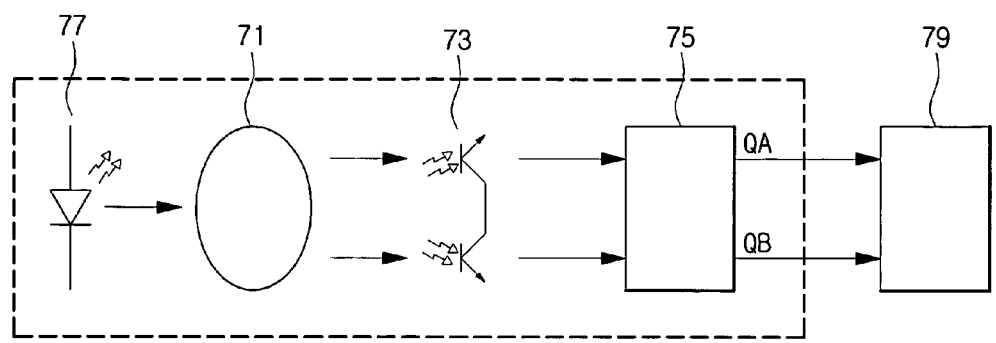
FIG. 4 is a block diagram illustrating the composition of an optical encoder.

The optical encoder, as illustrated in FIG. 4, comprises a light source 77, a wheel 71 (transparent or latticed), a phototransistor 73, and a potential circuit 75. The light emitted from the light source 77 is passed through the wheel 71 and projected onto the light receiving surface of the phototransistor 73, to enable the phototransistor 73 to convert the light signal to an electrical signal, while at the same time increasing the potential. The potential signal thus obtained is transmitted via the potential circuit 75 to the determining circuit 79, where the determining circuit 79 determines the output signal of the optical encoder.

The holder 55 is positioned between the sensor 57 and the printed circuit board 59 to not only provide electrical signals inputted via the printed circuit board 59 to the sensor 57, but also determine the height of the sensor 57. The holder 55 comprises a terminal 53 which electrically connects the sensor 57 and the printed circuit board 59, and a mold 54 which surrounds the exterior of the terminal 53.

The terminal 53 has a cross section shaped like a "C," and is made of a metal material. The terminal 53 has a board fixing part 63, which is the part that is fixed to the printed circuit board 59, a vertical part 65, which protrudes vertically from the board fixing part 63, and a sensor fixing part 67, which extends horizontally from the vertical part 65.

The board fixing part 63 is formed parallel to the printed circuit board 59 and is fixed onto the printed circuit board 59 by means of solder 61, etc. The electrical signal inputted through the printed circuit board 59 is inputted through the board fixing part 63, passed through the vertical part 65 and the sensor fixing part 67, and inputted to the sensor 57.

The vertical part 65 is positioned between the board fixing part 63 and the sensor fixing part 67 to connect the two. Also, the vertical part 65 determines the height at which the sensor 57 is fixed. The sensor fixing part 67 extends horizontally from an end of the vertical part 65, and the sensor 57 is fixed by means of solder to its upper surface.

The terminal 53, composed of the board fixing part 63, vertical part 65, and sensor fixing part 67, is fixed by the mold 54. The mold 54 is formed from plastic, etc., and has the shape of a cylinder encasing the terminal 53 in its interior. All or some portions of the sensor fixing part 67 may be exposed at the upper surface of the mold 54, and all or some portions of the board fixing part 63 may be exposed at the lower surface. This allows the sensor fixing part 67 and the board fixing part 63 to be connected by means of solder to the sensor 57 and the printed circuit board 59, respectively.

The printed circuit board 59 is generally fixed to the lower surface of the motor, and performs the functions of transferring various signals inputted from the exterior to the sensor 57 and transferring signals outputted from the sensor 57 to outside elements (not shown). The printed circuit board 59 is fixed to the board fixing part 63 of the terminal 53 by means of solder, etc. Also, the printed circuit board 59 is supported by a metal plate 51. The metal plate 51 is joined to the holder 29, etc., of the motor, to support the motor's stator.

The method of assembling a sensor fixing device according to an embodiment of the invention is as follows. First, the sensor 57 is fixed to the sensor fixing part 67 of the terminal 53 using a reflow process. Then, the holder 55, to which the sensor 57 has been joined, is fixed to a predetermined position on the printed circuit board 59, after which the board fixing part 63 of the terminal 53 is fixed to the printed circuit board 59 using a reflow process.

As described above, the method of assembling a sensor fixing device according to an embodiment of the invention comprises fixing the sensor 57 and fixing the holder 55, so that the process is made simple. This allows reductions in production times and costs, as well as a decrease in the defect rate.

The present invention can thus provide a sensor fixing device having a reduced number of components and a simplified assembly process.

While the above description has pointed out novel features of the invention as applied to the embodiments disclosed above, it is to be construed that various permutations and modifications are included within the scope of the present invention.

What is claimed is:

1. An optical disk apparatus, comprising:
    a printed circuit board;
    a stator fixed on the printed circuit board
    a rotor configured to receive an optical disk thereon, the rotor being rotated by an electromagnetic interaction with the stator; and
    a sensing part fixed on the printed circuit board and sensing a rotation of the optical disk, wherein the sensing part comprises:
        a sensor;
        a terminal having a cross section shaped like a "C" and connecting the sensor with the printed circuit board electrically; and
        a plastic mold having a shape of a cylinder encasing the terminal and fixing the terminal thereto.

2. The optical disk apparatus of claim 1, wherein the sensor is an optical encoder.

3. The optical disk apparatus of claim 1, wherein the sensor is fixed to the terminal by means of solder.

4. The optical disk apparatus of claim 1, wherein the terminal comprises:
    a board fixing part fixed to the printed circuit board;
    a vertical part extending from the board fixing part and having a particular height; and
    a sensor fixing part extending from an end of the vertical part and electrically connected with the sensor.

5. The optical disk apparatus of claim 4, wherein the sensor fixing part is fixed to the sensor by means of solder.

6. The optical disk apparatus of claim 4, wherein the board fixing part is fixed to the printed circuit board by means of solder.

7. The optical disk apparatus of claim 1, wherein the printed circuit board is supported by a metal plate.

* * * * *

UNITED STATES PATENT AND TRADEMARK OFFICE
CERTIFICATE OF CORRECTION

PATENT NO. : 7,514,671 B2 Page 1 of 1
APPLICATION NO. : 11/516771
DATED : April 7, 2009
INVENTOR(S) : Dong-Yeon Shin et al.

It is certified that error appears in the above-identified patent and that said Letters Patent is hereby corrected as shown below:

Column 4, Line 30, change "board" to --board;--.

Signed and Sealed this

Thirtieth Day of June, 2009

JOHN DOLL
*Acting Director of the United States Patent and Trademark Office*